United States Patent [19]
Oh

[11] Patent Number: 5,790,468
[45] Date of Patent: Aug. 4, 1998

[54] REFRESH COUNTER FOR SYNCHRONOUS DYNAMIC RANDOM ACCESS MEMORY AND METHOD OF TESTING THE SAME

[75] Inventor: Jong Hoon Oh, Kyoungki-do, Rep. of Korea

[73] Assignee: Hyundai Electronics Industries Co., Ltd., Ichon, Rep. of Korea

[21] Appl. No.: 862,699

[22] Filed: May 23, 1997

[30] Foreign Application Priority Data

Jun. 3, 1996 [KR] Rep. of Korea ............... 1996-19637

[51] Int. Cl.[6] .................................................. G11C 7/00
[52] U.S. Cl. .................... 365/222; 365/201; 365/230.03
[58] Field of Search ........................... 365/222, 230.03, 365/201

[56] References Cited

U.S. PATENT DOCUMENTS

| | | | |
|---|---|---|---|
| 4,672,583 | 6/1987 | Nakaizumi | 365/222 |
| 5,430,680 | 7/1995 | Parris | 365/222 |
| 5,446,696 | 8/1995 | Ware et al. | 365/222 |
| 5,471,430 | 11/1995 | Sawada et al. | 365/222 |
| 5,566,119 | 10/1996 | Matano | 365/222 |
| 5,583,818 | 12/1996 | You et al. | 365/222 |
| 5,583,823 | 12/1996 | Park | 365/230.03 |
| 5,619,468 | 4/1997 | Ghosh et al. | 365/222 |
| 5,623,451 | 4/1997 | Kawagoe | 365/222 |
| 5,636,173 | 6/1997 | Schaefer | 365/230.03 |
| 5,659,515 | 8/1997 | Matsua et al. | 365/222 |

Primary Examiner—David C. Nelms
Assistant Examiner—Hien Nguyen
Attorney, Agent, or Firm—Reid & Priest LLP

[57] ABSTRACT

A refresh counter for an SDRAM and a method of testing the same. An internal bank select address for the test of the refresh counter has a predetermined state in a test mode to correspond to an external bank select address in a burst mode, so that the refresh counter can simply be tested in the test mode. The refresh counter comprises a first counter circuit for outputting a least significant bit as the internal bank select address in the test mode in response to an address signal and a reset pulse signal. The address signal is generated in each automatic refresh cycle, and the reset pulse signal is generated when the present mode is set to the test mode by a mode register set command. The refresh counter further comprises n second counter circuits connected in series to the first counter circuit, for outputting n bits of a row address.

7 Claims, 6 Drawing Sheets

REFRESH COUNTER FOR SYNCHRONOUS DYNAMIC RANDOM ACCESS MEMORY AND METHOD OF TESTING THE SAME

BACKGROUND OF THE INVENTION

1. Field of the Invention

The present invention relates in general to a synchronous dynamic random access memory (referred to hereinafter as SDRAM), and more particularly to a refresh counter for the SDRAM and a method of testing the same, in which an internal bank select address for the test of the refresh counter has a predetermined state in a test mode to correspond to an external bank select address in a burst mode, so that the refresh counter can simply be tested in the test mode.

2. Description of the Prior Art

Generally, an automatic refresh operation of an SDRAM is analogous to a column address strobe-before-row address strobe (CAS-before-RAS: CBR) refresh operation of a DRAM. The automatic refresh operation is to input a row address from a refresh counter in the chip and advance a refresh cycle in response to the input row address.

The automatic refresh operation of the SDRAM has the following characteristics.

The automatic refresh operation is performed in a self-timed row address strobe manner in which a row address strobe signal of a selected bank is made active after an automatic refresh command is applied, and then automatically returned to a precharge state after the lapse of a predetermined delay time. An automatic refresh exit command is not necessary.

A bank select address is a least significant bit of a refresh counter which is toggled in each automatic refresh cycle.

For a better understanding of the specification, the meaning of signals related to an SDRAM will hereinafter be described.

The "CLK" signifies a system clock signal.

The "command" signifies a command signal which is determined by the combination of a chip select signal /CS, a row address strobe bar signal /RAS, a column address strobe bar signal /CAS and a write enable signal /We.

The "Auto Refresh" signifies an automatic refresh command signal analogous to a CAS-before-RAS refresh command signal in a conventional DRAM.

The "xcnt[0:n]" signifies output signals from the refresh counter corresponding to row address bits of 0 to n.

The "xcnt [BS]" signifies an output signal from the refresh counter corresponding to a bank select address. In the SDRAM, the signal xcnt[BS] is a least significant bit of the refresh counter.

The "xcntine" signifies a sequentially increased signal from the refresh counter. The signal xcntine is generated in each automatic refresh cycle.

The "RAS_Bk[0:1]" signifies a row address strobe signal corresponding to a bank 0 or bank 1, which is analogous to an output signal from a row address strobe bar input buffer in a conventional DRAM.

The "MRS" signifies a mode register set command signal for programming the status of a mode register required in the SDRAM.

The "test mode" is an OP-code corresponding to a seventh bit of the mode register. If the OP-code is set to "H", the present mode is set to a test mode to enter a refresh counter test cycle.

The "WT" or "RD" signifies a burst write or read command signal.

The "Bk[i].[j]" signifies a selected bank.

The "tRC.min" signifies a minimum row address strobe cycle time.

The "tRCD" signifies the time required from a row address strobe active point to a burst command point.

The "tRP" signifies a minimum row address strobe precharge time.

The "PCG_All (precharge all banks)" signifies a signal for allowing all banks in the SDRAM to enter a precharge state at the same time.

The "tRRD" signifies a minimum time required between successive row address strobe active points, namely, a row address strobe active time difference between the successive banks.

The "BS" signifies an external bank select address.

The "YA" signifies a column address where a burst mode is advanced.

The automatic refresh and test mode operations of the conventional SDRAM will hereinafter be described with reference to FIGS. 1 to 3.

FIG. 1 is a block diagram illustrating the construction of a conventional refresh counter for an SDRAM. As shown in this drawing, the refresh counter includes a first counter circuit 11 for outputting a least significant bit as a bank select address xcnt[BS] in response to an address signal xcntinc which is generated in each automatic refresh cycle. The bank select address xcnt[BS] is toggled in each automatic refresh cycle. The refresh counter further includes n counter circuits connected in series to the first counter circuit 11, for outputting n bits of a row address.

FIGS. 2a to 2f are timing diagrams illustrating an automatic refresh operation of the conventional refresh counter in FIG. 1. An automatic refresh command is generated as shown in FIG. 2b by the combination of a chip select signal /CS, a row address strobe bar signal /RAS, a column address strobe bar signal /CAS and a write enable signal /We. Upon receiving the automatic refresh command, the first counter circuit 11 in the refresh counter in FIG. 1 generates the bank select address xcnt[BS] which is toggled in each automatic refresh cycle, as shown in FIG. 2c. A row address strobe signal RAS_Bk1 corresponding to a bank 1 goes from low to high in logic, as shown in FIG. 2e, in response to the first automatic refresh command. The row address strobe signal RAS_Bk1 remains at its high logic state for a predetermined time period. Then, a row address strobe signal RAS_Bk0 corresponding to a bank 0 goes from low to high in logic, as shown in FIG. 2f, in response to the second automatic refresh command. The row address strobe signal RAS_Bk0 remains at its high logic state for the predetermined time period.

FIGS. 3a to 3f are timing diagrams illustrating a test mode operation of the conventional refresh counter in FIG. 1. The refresh counter enters the test mode as shown in FIG. 3d in response to a mode register set command MRS. At this time, the self-timed row address strobe function is blocked in a different manner from the normal automatic refresh operation. As a result, the row address strobe signal is returned to the precharge state in response to an external precharge command after the burst write or read cycle is advanced. Noticeably, in contrast to the DRAM, the SDRAM must input a bank select address for selecting a corresponding one of multiple banks in the chip in a burst mode corresponding to a column cycle.

However, the bank select address xcnt[BS] from the internal refresh counter must be supplied in the automatic refresh mode and a row address strobe signal of a bank corresponding to the external bank select address BS must be made active in the burst mode.

SUMMARY OF THE INVENTION

The present invention has been made in view of the above problem, and it is an object of the present invention to provide a refresh counter for an SDRAM and a method of testing the same, in which an internal bank select address for the test of the refresh counter has a predetermined state in a test mode to correspond to an external bank select address in a burst mode, so that the refresh counter can simply be tested in the test mode.

In accordance with one aspect of the present invention, there is provided a method for testing a refresh counter in a synchronous dynamic random access memory, the synchronous dynamic random access memory having $2^m$ internal banks, comprising the first step of sequentially inputting k bank select address bits beginning with a least significant bit of the refresh counter; the second step of making row address strobe signals of all the banks active in response to $2^k$ successive automatic refresh commands; the third step of performing a write or read operation with respect to each of the banks in response to $2^m$ burst commands after the last automatic refresh command is applied; and the fourth step of returning the row address strobe signals of all the banks to their precharge states in response to a row address strobe precharge command.

In accordance with another aspect of the present invention, there is provided a refresh counter for a synchronous dynamic random access memory, the synchronous dynamic random access memory having at least two internal banks, comprising first counter means for outputting a least significant bit as a bank select address in a test mode in response to an address signal and a reset pulse signal, the address signal being generated in each automatic refresh cycle, the reset pulse signal being generated when the present mode is set to the test mode by a mode register set command; and n second counter means connected in series to the first counter means, for outputting n bits of a row address.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
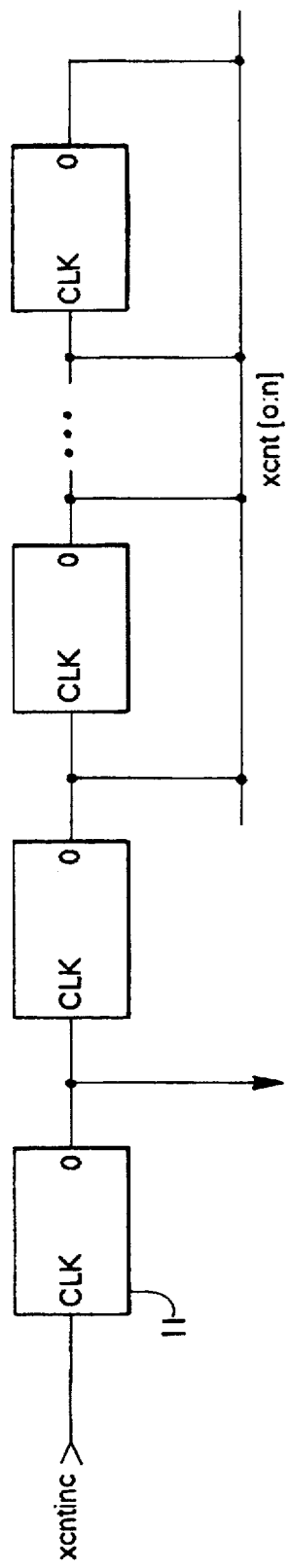
FIG. 1 is a block diagram illustrating the construction of a conventional refresh counter for an SDRAM.
Figure 4:
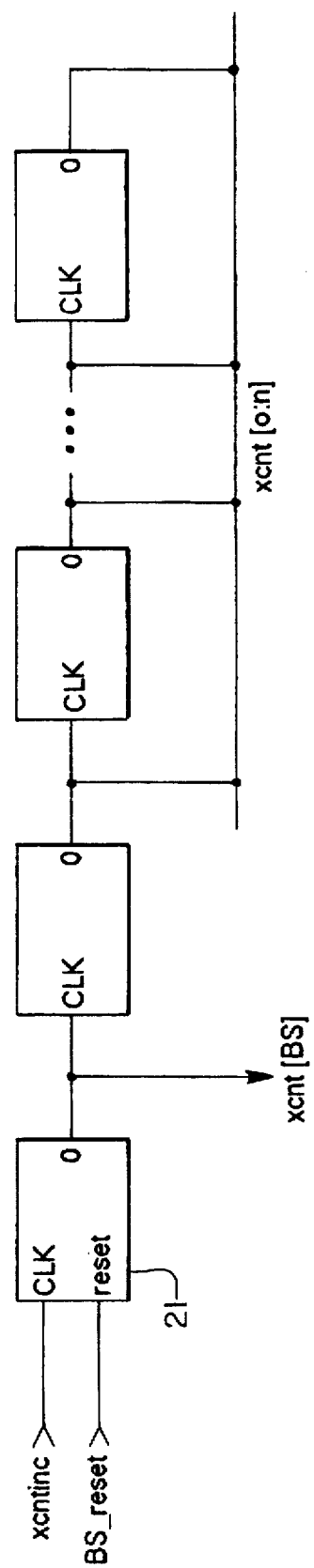
FIG. 4 is a block diagram illustrating the construction of a refresh counter for an SDRAM in accordance with the present invention.
Figure 2:
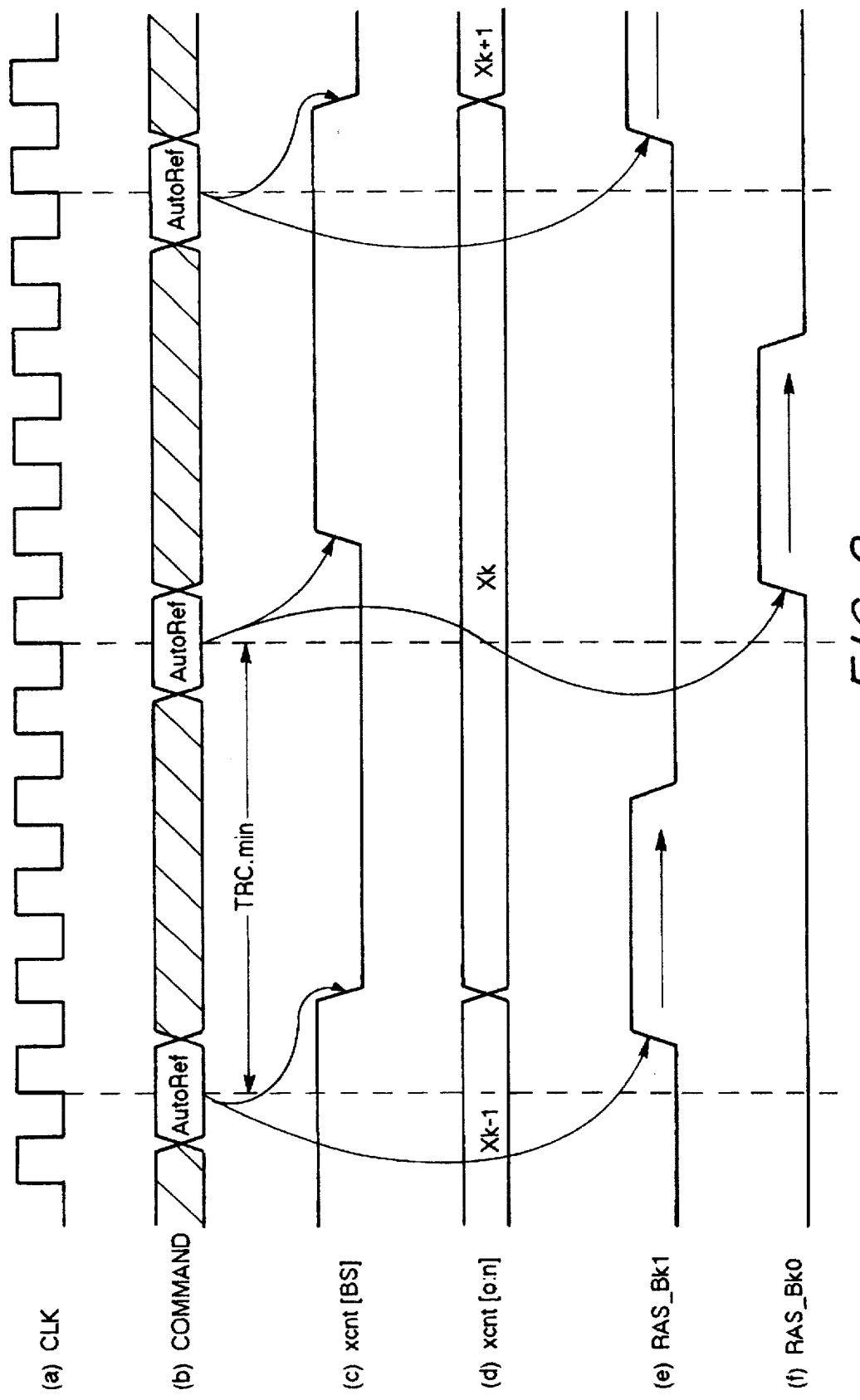
FIGS. 2a to 2f are timing diagrams illustrating an automatic refresh operation of the conventional refresh counter in FIG. 1.
Figure 3:
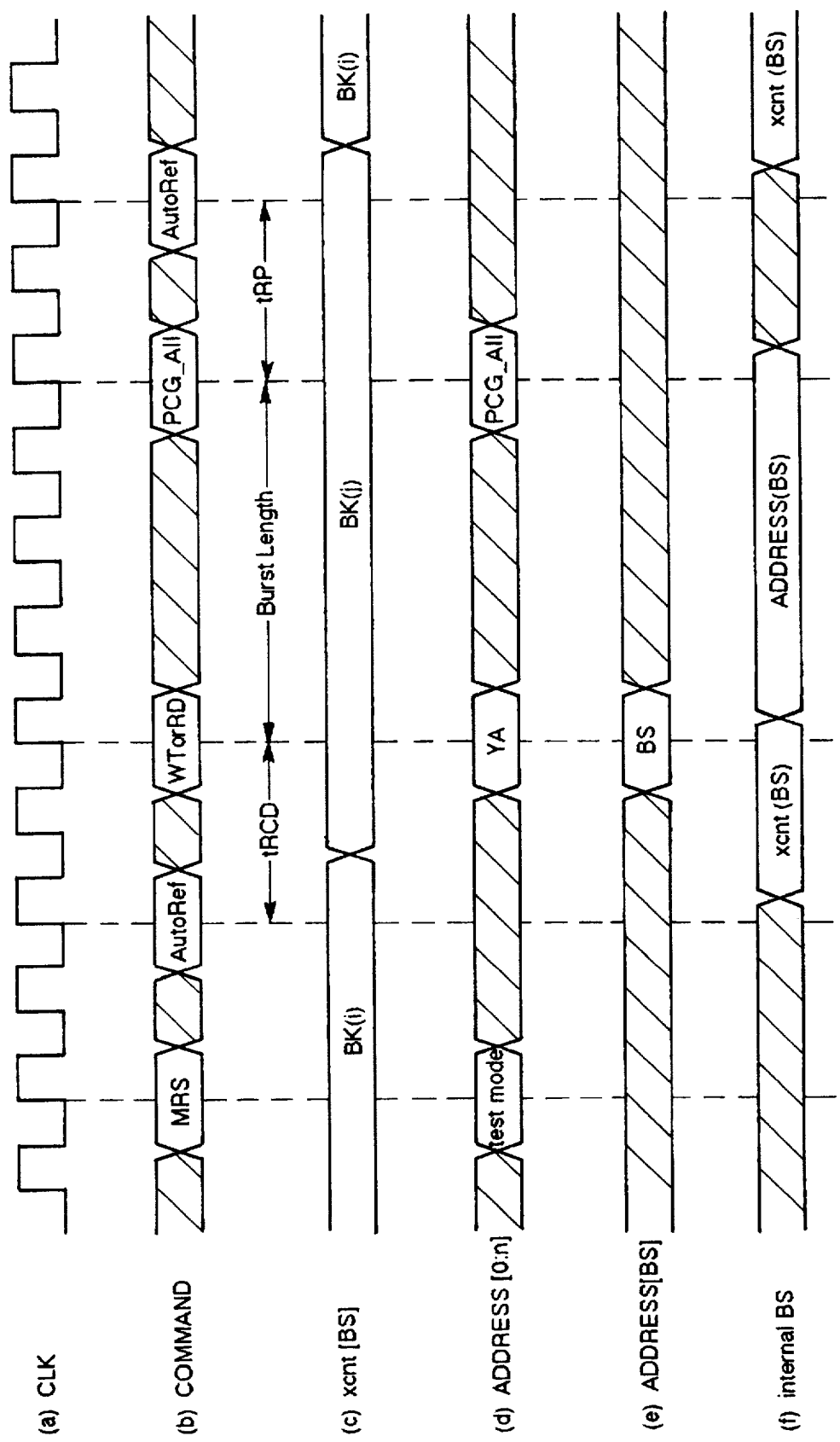
FIGS. 3a to 3f are timing diagrams illustrating a test mode operation of the conventional refresh counter in FIG. 1.

FIG. 4 is a block diagram illustrating the construction of a refresh counter for an SDRAM in accordance with the present invention. As shown in this drawing, the refresh counter includes a first counter circuit 21 for outputting a least significant bit as a bank select address xcnt[BS] in a test mode in response to an address signal xcntinc which is generated in each automatic refresh cycle and a reset pulse signal BS_reset which is generated when the present mode is set to the test mode by a mode register set command MRS.

The refresh counter further includes n counter circuits connected in series to the first counter circuit 21, for outputting n bits of a row address.

Figure 5:
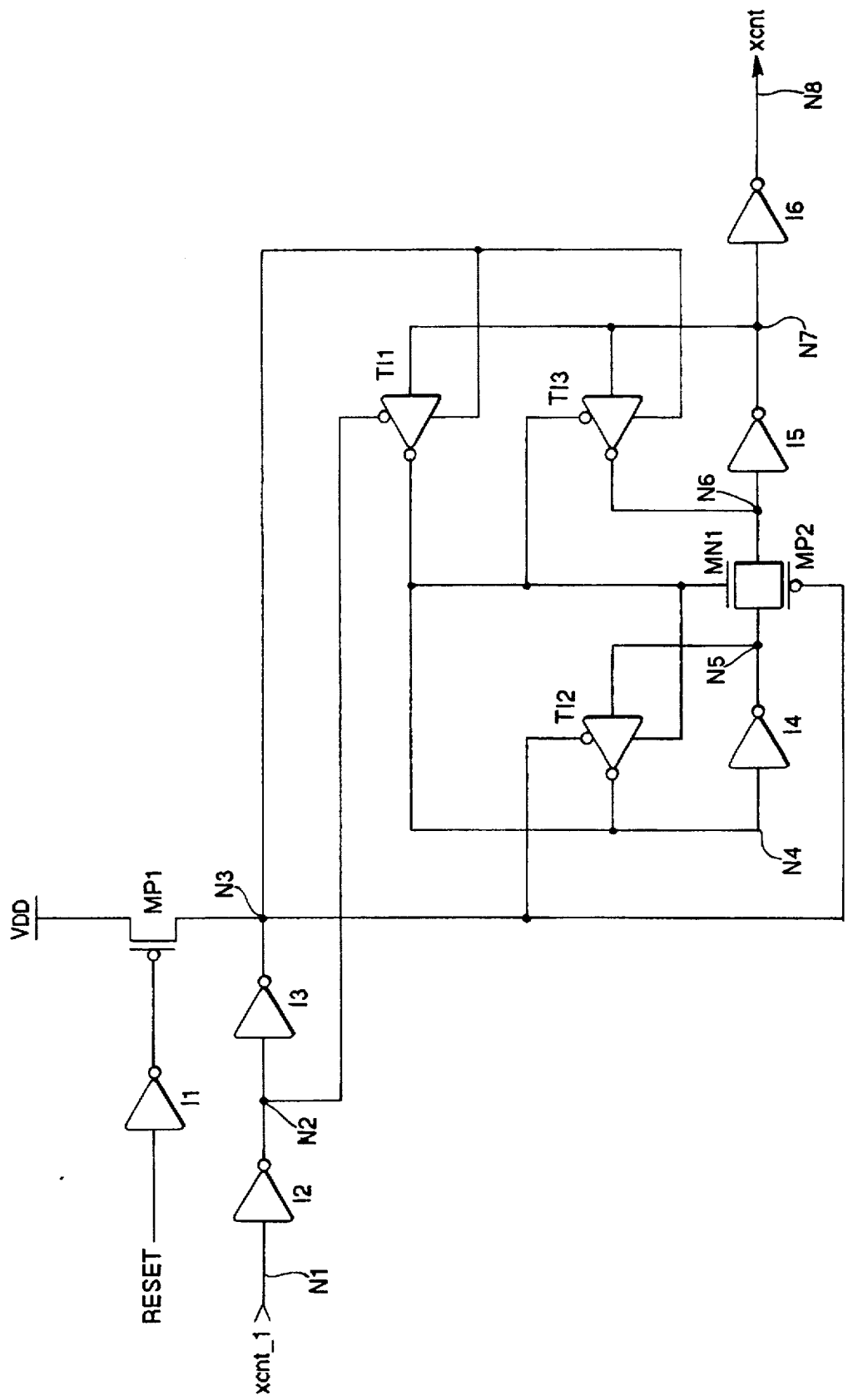
FIG. 5 is a detailed circuit diagram illustrating the construction of a first counter circuit in FIG. 4.

FIG. 5 is a detailed circuit diagram illustrating the construction of the first counter circuit 21 in FIG. 4. As shown in this drawing, the first counter circuit 21 includes a first node N1 for inputting the address signal xcnt_1, a first inverter I1 for inverting the reset pulse signal RESET, a second inverter I2 connected between the first node N1 and a second node N2, a third inverter I3 connected between the second node N2 and a third node N3, a first PMOS transistor MP1 connected between a supply voltage source Vdd and the third node N3 and having its gate for inputting an output signal from the first inverter I1, a first transfer inverter TI1 for inverting a signal at a seventh node N7 in response to signals at the second and third nodes N2 and N3 and transferring the inverted signal to a fourth node N4, a fourth inverter I4 connected between the fourth node N4 and a fifth node N5, a second transfer inverter TI2 for inverting a signal at the fifth node N5 in response to the signals at the second and third nodes N2 and N3 and transferring the inverted signal to the fourth node N4, and a transfer gate for transferring the signal at the fifth node N5 to a sixth node N6 in response to the signals at the second and third nodes N2 and N3. The transfer gate is provided with a first NMOS transistor MN1 and a second PMOS transistor MP2 connected in parallel between the fifth and sixth nodes N5 and N6. The first NMOS transistor MN1 has its gate for inputting the signal at the second node N2, and the second PMOS transistor MP2 has its gate for inputting the signal at the third node N3.

The first counter circuit 21 further includes a fifth inverter I5 connected between the sixth and seventh nodes N6 and N7, a third transfer inverter TI3 for inverting the signal at the seventh node N7 in response to the signals at the second and third nodes N2 and N3 and transferring the inverted signal to the sixth node N6, and a sixth inverter I6 connected between the seventh node N7 and an eighth node N8.

With this construction, the first counter circuit 21 receives the address signal xcnt_1 which is generated in each automatic refresh cycle and the reset pulse signal RESET which is generated when the present mode is set to the test mode by the mode register set command MRS, and outputs the least significant bit as the bank select address xcnt[BS] in the test mode in response to the received signals.

Figure 6:
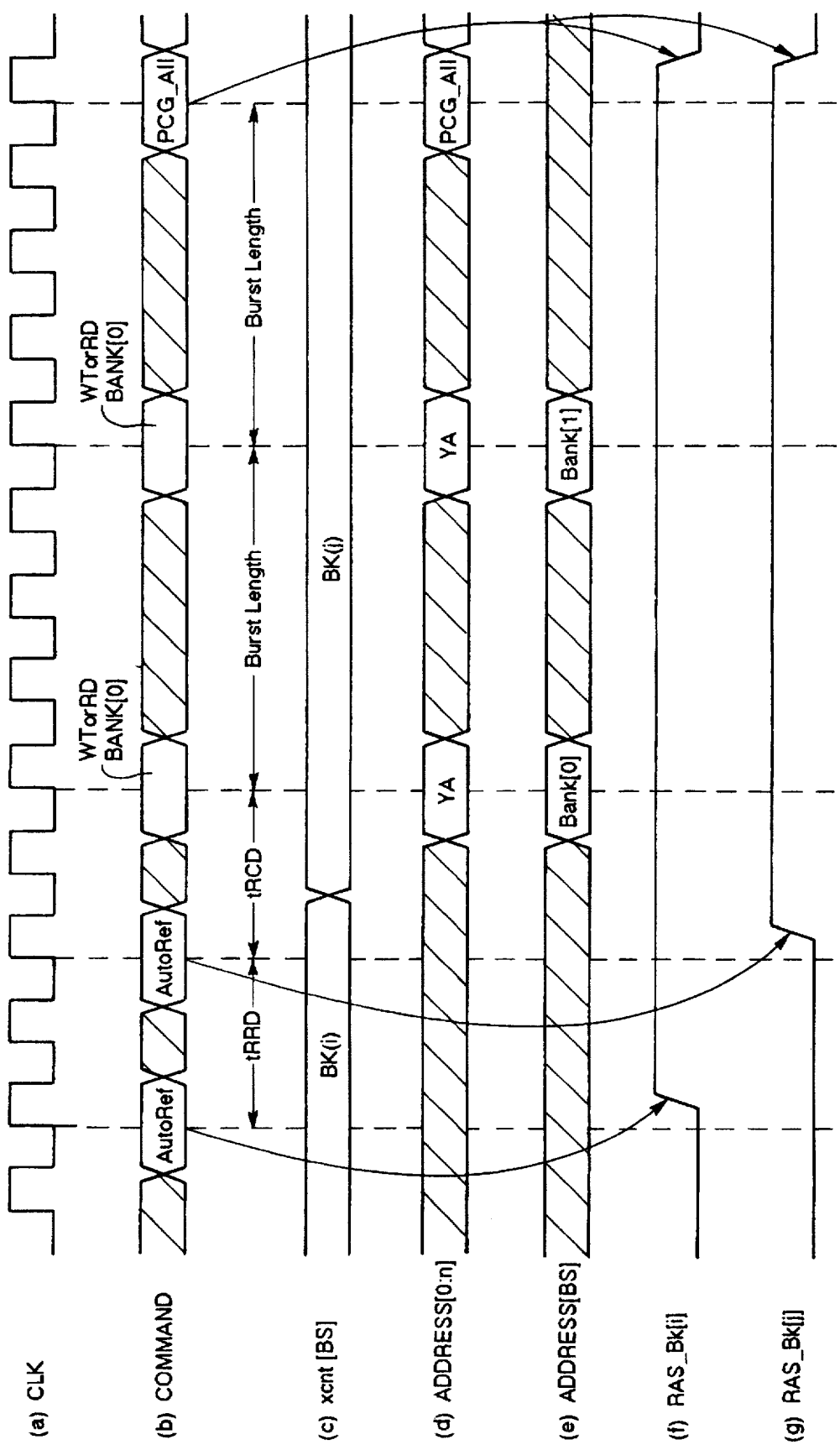
FIGS. 6a to 6g are timing diagrams illustrating a test mode operation of the refresh counter in FIG. 4 in accordance with a first embodiment of the present invention.
Figure 7:
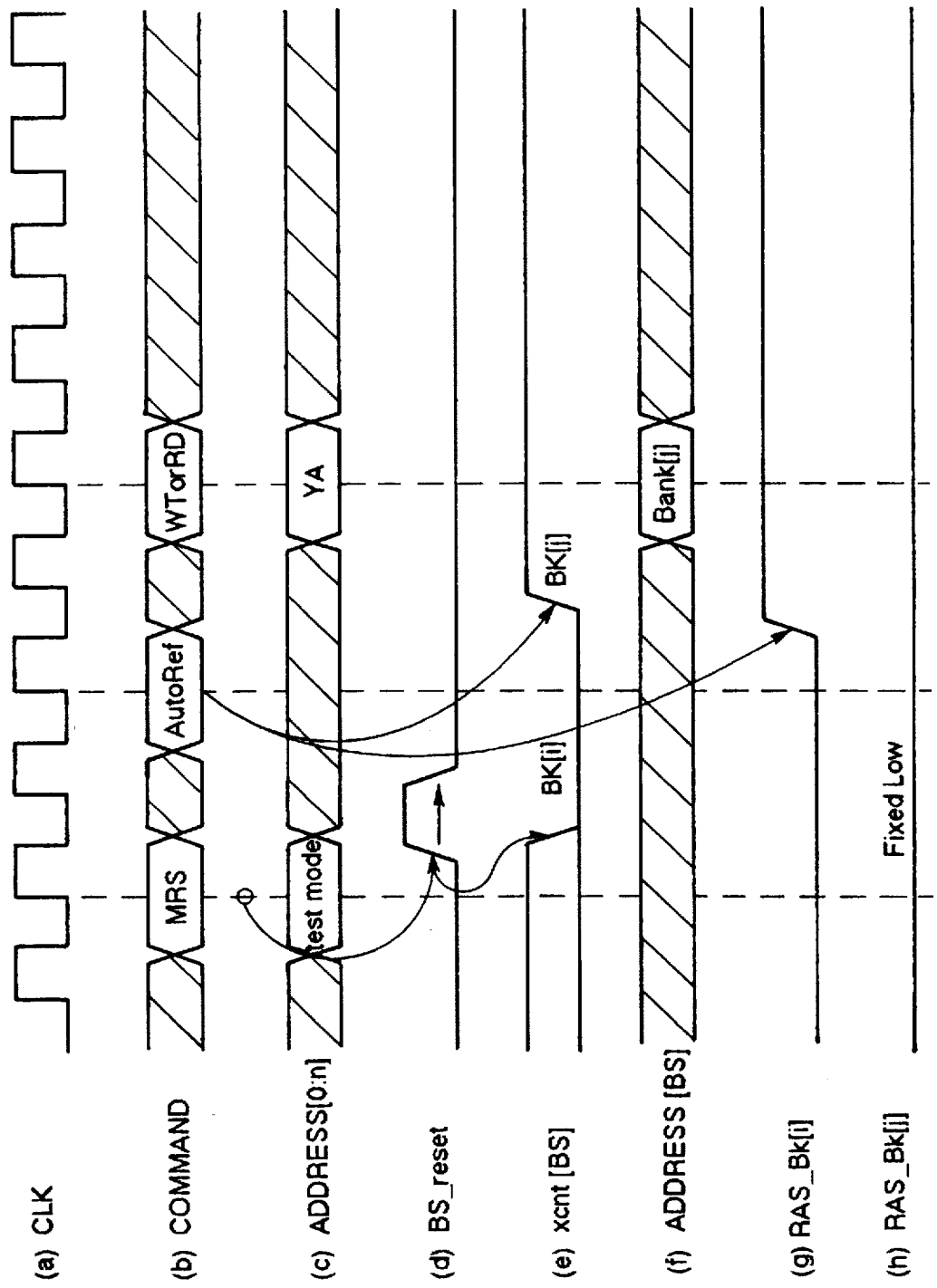
FIGS. 7a to 7h are timing diagrams illustrating a test mode operation of the refresh counter in FIG. 4 in accordance with a second embodiment of the present invention.

The operation of the refresh counter with the above-mentioned construction in accordance with the present invention will hereinafter be described in detail with reference to FIGS. 6 and 7.

FIGS. 6a to 6g are timing diagrams illustrating a test mode operation of the refresh counter in FIG. 4 in accordance with a first embodiment of the present invention. For example, in the case where the SDRAM has a 16M capacity, the bank select address corresponds to a pin All. Because the bank select address is the least significant bit of the refresh counter, it is toggled in each automatic refresh cycle. Namely, if the bank select address has an initial value of "0", then it has periodic values of 0→1→0→1 ... In the case where the bank select address has an initial value of "1", then it has periodic values of 1→0→1→0 ... As a result, two banks are alternately selected for an interval of two automatic refresh cycles regardless of an initial value of the bank select address. In consideration of such a situation, the construction of FIG. 5 is implemented for the test mode operation of the refresh counter, thereby allowing a burst mode operation to be advanced with no problem in the selection of an external bank select address.

If two automatic refresh commands are applied, row address strobe signals of the corresponding two banks are made active. The burst mode operation is enabled when a predetermined time period tRCD has elapsed after the application of the second automatic refresh command. If two burst commands are applied, a read or write operation is performed with respect to each of the two banks because the row address strobe signals of the two banks are both at their active states. After the two burst cycles are completed, the row address strobe signals of the two banks are returned to their precharge states in response to a row address strobe precharge command.

FIGS. 7a to 7h are timing diagrams illustrating a test mode operation of the refresh counter in FIG. 4 in accordance with a second embodiment of the present invention. When the present mode is set to the test mode by the mode register set command MRS, the reset pulse signal BS_reset is generated as well-known in the art and then applied to a reset input terminal of the first counter circuit 21. At this time, the bank select address xcnt[BS] from the first counter circuit 21 has a predetermined logic state. As a result, the first external bank select address can readily be inputted to perform the burst cycle.

As is apparent from the above description, according to the present invention, the refresh counter can simply be tested in the test mode.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for testing a refresh counter in a synchronous dynamic random access memory, said synchronous dynamic random access memory having $2^m$ internal banks, comprising the steps of:

(a) sequentially inputting k bank select address bits beginning with a least significant bit of said refresh counter;

(b) making row address strobe signals of all said banks active in response to $2^k$ successive automatic refresh commands;

(c) performing a write or read operation with respect to each of said banks in response to $2^m$ burst commands after the last automatic refresh command is applied; and (d) returning said row address strobe signals of all said banks to their precharge states in response to a row address strobe precharge command.

2. A method for testing a refresh counter in a synchronous dynamic random access memory, as set forth in claim 1, wherein said m is an integer greater than or equal to 1.

3. A method for testing a refresh counter in a synchronous dynamic random access memory, as set forth in claim 1, wherein said k is an integer smaller than or equal to said m.

4. A refresh counter for a synchronous dynamic random access memory, said synchronous dynamic random access memory having at least two internal banks, comprising:

first counter means for outputting a least significant bit as a bank select address in a test mode in response to an address signal and a reset pulse signal, said address signal being generated in each automatic refresh cycle, said reset pulse signal being generated when the present mode is set to the test mode by a mode register set command; and n second counter means connected in series to said first counter means, for outputting n bits of a row address.

5. A refresh counter for a synchronous dynamic random access memory, as set forth in claim 4, wherein said first and second counter means are set to a predetermined state in response to said reset pulse signal.

6. A refresh counter for a synchronous dynamic random access memory, as set forth in claim 4, wherein said bank select address has a predetermined initial value based on said reset pulse signal.

7. A refresh counter for a synchronous dynamic random access memory, as set forth in claim 4, wherein said bank select address is provided with bits beginning with said least significant bit and increased in a predetermined order in response to an automatic refresh command, with said row address being increased whenever a bank select address cycle is completed.

* * * * *